United States Patent

Corey, Jr. et al.

[11] Patent Number: 4,751,393
[45] Date of Patent: Jun. 14, 1988

[54] DOSE MEASUREMENT AND UNIFORMITY MONITORING SYSTEM FOR ION IMPLANTATION

[75] Inventors: Philip D. Corey, Jr., Wenham; Paul M. Lundquist, Magnolia; Robert V. Brick, Gloucester, all of Mass.

[73] Assignee: Varian Associates, Inc., Palo Alto, Calif.

[21] Appl. No.: 864,584

[22] Filed: May 16, 1986

[51] Int. Cl.⁴ ............................................. G01N 23/00
[52] U.S. Cl. ................................. 250/492.21; 250/357
[58] Field of Search ..................... 250/492.21, 397, 398

[56] References Cited

U.S. PATENT DOCUMENTS

| | | | |
|---|---|---|---|
| 3,689,766 | 9/1972 | Freeman | 250/492.21 |
| 3,857,090 | 12/1974 | Chick | 250/492.21 |
| 4,021,675 | 5/1977 | Shifrim | 250/492.21 |
| 4,260,897 | 4/1981 | Bakker et al. | 250/492.21 |
| 4,283,631 | 8/1981 | Turner | 250/492.2 |
| 4,628,209 | 12/1986 | Wittkower | 250/492.21 |

*Primary Examiner*—Bruce C. Anderson
*Attorney, Agent, or Firm*—Stanley Z. Cole; Gerald M. Fisher; Terrence E. Dooher

[57] ABSTRACT

Apparatus for determining ion dose and ion dose uniformity of an ion beam scanned over a target plane in response to scanning signals includes a mask assembly for sensing the beam current at several different locations and providing a single beam current signal. The mask assembly includes a mask plate with sensing apertures and an annular Faraday cup aligned with the apertures for sensing beam current. The beam current signal is integrated over time to determine ion dose. A demultiplexer, in response to x and y scan signals, separates the beam current signal into separate signal components from each sensing aperture. Ion dose uniformity is determined by comparing the separate signal components, integrated over time, with an average value of the signal component.

20 Claims, 5 Drawing Sheets

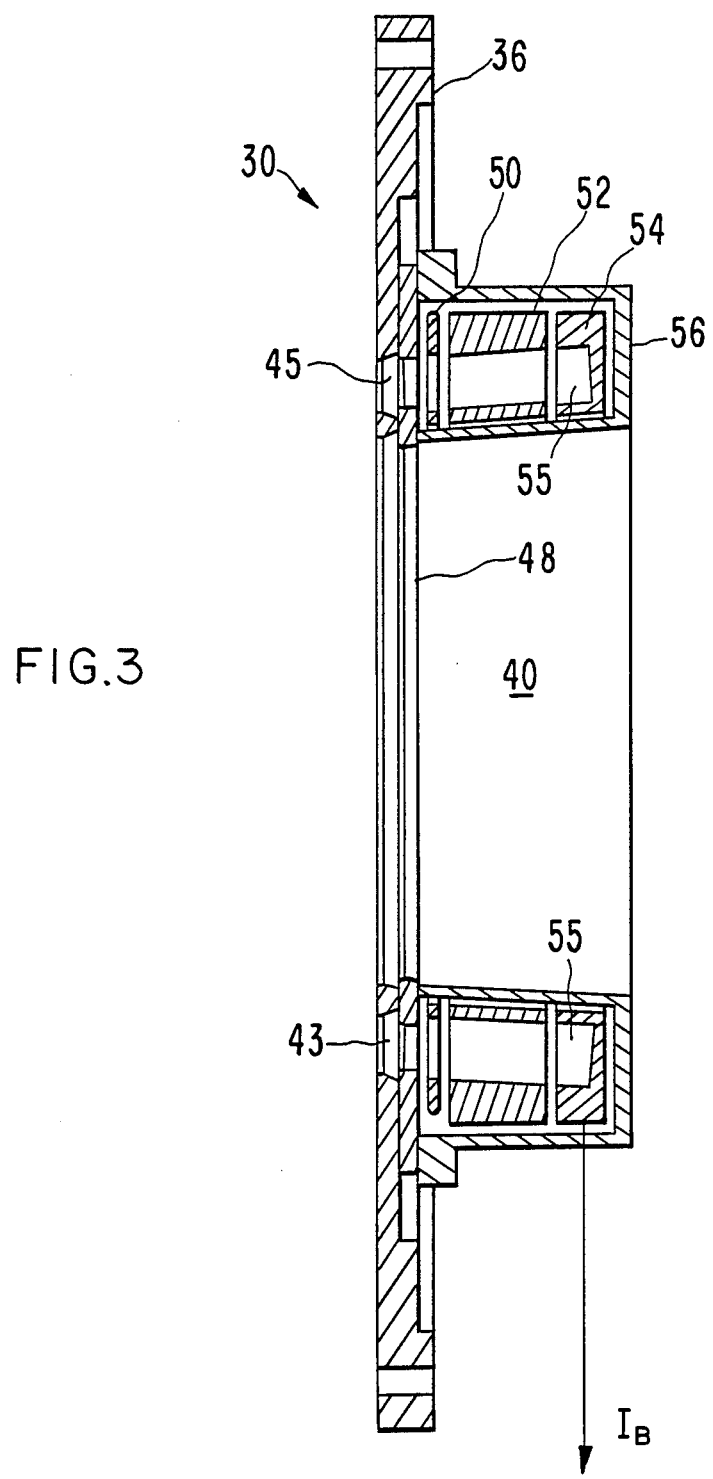

DOSE MEASUREMENT AND UNIFORMITY MONITORING SYSTEM FOR ION IMPLANTATION

FIELD OF THE INVENTION

This invention relates to ion implantation of semiconductor wafers and, more particularly, to a system for ion dose measurement and uniformity monitoring in an ion implantation system.

BACKGROUND OF THE INVENTION

Ion implantation has become a standard technique for introducing impurities into semiconductor wafers. The impurities determine the conductivity of the region into which they are implanted. Impurities are introduced into the bulk of semiconductor wafers by using the momentum of energetic ions as a means of imbedding them into the crystalline lattice of the semiconductor material. The fabrication process for integrated circuit devices usually includes several ion implantation steps for impurity doping of different device regions.

Ion implantation systems typically include an ion source for converting a gas or a solid material into a well-defined ion beam. The beam is mass analyzed to eliminate undesired ion species, is accelerated to the desired energy and is focused onto a target plane. The beam is deflected over the target area by beam scanning, by target movement, or a combination of scanning and target movement. One form of beam scanning utilizes two-dimensional electrostatic scanning over the target area utilizing a raster scan (see, for example, U.S. Pat. No. 4,283,631).

In the operation of ion implantation systems, it is necessary to measure the cumulative ion dose implanted in the semiconductor wafer, since the number of ions implanted determines the conductivity of the implanted region. Typically, ion implants are specified in terms of ion species, ion energy and dosage in ions per square centimeter. Continuous measurement of ion dosage is necessary, since ion sources do not deliver accurate, constant ion beam currents. It is further necessary to monitor the spatial uniformity of the implanted dose over the surface area of the wafer. Spatial uniformity variations outside specified limits will result in operating characteristics which vary from device to device. Semiconductor fabrication processes typically require dose accuracy within one percent and dose uniformity of less than one percent.

In the past, cumulative ion dose has been measured by a Faraday cup positioned in front of the target wafer. The ion beam passes through the Faraday cup to the wafer and produces a current in the Faraday. The wafer itself is part of the Faraday system and cannot be grounded. The Faraday current is supplied to an electronic dose processor which integrates the current with respect to time to determine the total ion dosage. Dose uniformity has been monitored by a corner cup arrangement. A mask having a central opening is positioned in the path of the ion beam. The beam is scanned over the area of the mask with the portion passing through the central opening impinging on the target wafer. Small Faraday cups are located at the four corners of the mask and sense the beam current at these locations. Individual conductors connect the four corner cups to a monitoring system which determines the deviation of the beam current at each corner from an average value. In some systems, the corner cups have been connected in common for measurement of cumulative ion dose.

It is a general object of the present invention to provide improved dose measurement and uniformity monitoring apparatus for use in a scanned charged particle beam system.

It is another object of the present invention to provide dose measurement and uniformity monitoring apparatus which is simple in construction and economical to manufacture.

It is a further object of the present invention to provide dose measurement and uniformity monitoring apparatus for a scanned charged particle beam system wherein a beam sensor having a single output current lead is used to determine ion dose and ion dose uniformity simultaneously.

SUMMARY OF THE INVENTION

According to the present invention, these and other objects and advantages are achieved in apparatus for determining ion dose and ion dose uniformity of an ion beam scanned over a target plane in response to a scanning signal. The apparatus comprises means for sensing the ion beam at a plurality of different sensing locations and for providing a beam signal representative of the ion beam current received at each of the sensing locations, means for integrating the beam signal with respect to time to determine ion dose, and uniformity monitoring means responsive to the scanning signal and to the beam signal for determining the beam current component received at each of the different sensing locations and determining ion dose uniformity therefrom.

Preferably, the sensing means includes a mask assembly positioned in the path of the ion beam in a plane substantially perpendicular to the beam. The mask assembly includes a mask plate having a first aperture for passage of the ion beam to the target plane and a plurality of beam sensing apertures positioned at each of the sensing locations around the first aperture, and an annular Faraday cup positioned behind the mask plate in alignment with the sensing apertures for sensing the beam current received through each of the sensing apertures. A single beam current signal is provided to the uniformity monitoring means, which includes demultiplexing means responsive to the scanning signal for identifying the sensing location of each beam current component and for switching the beam signal in response to the determination. The demultiplexer provides the capability to simultaneously measure ion dose and ion dose uniformity with the same sensor assembly.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 3 is a cross-sectional view of the mask assembly shown in FIG. 2 taken along the line 3—3;

DETAILED DESCRIPTION OF THE INVENTION

Figure 1:
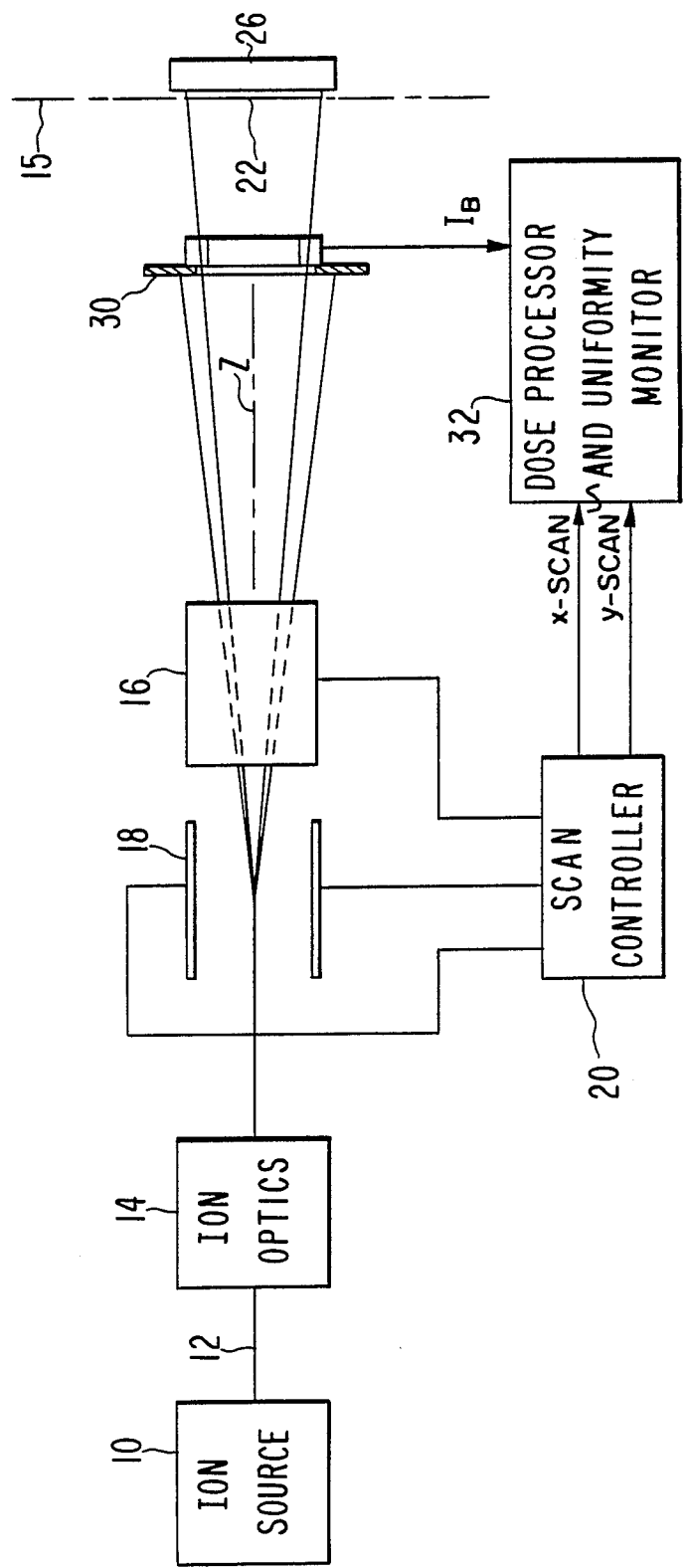
FIG. 1 is a simplified block diagram of an ion implantation system in accordance with the present invention.

A simplified diagram of an ion implantation system including the apparatus of the present invention is shown in FIG. 1. An ion source 10 operates within a high voltage terminal (not shown) at a selectable potential, typically in the range of 10 KeV–200 KeV. Ion source 10 converts a gas of selected species into a well-defined ion beam 12. The ion beam 12 passes through ion optics 14 which include an analyzer magnet for selecting a desired species, beam defining slits, an accelerating tube and a lens for focusing the beam in a target plane 15. The system utilizes an electrostatic deflection system including x-deflection plates 16 and y-deflection plates 18 to scan the beam 12 over the target plane 15. The waveforms for deflecting the beam 12 are generated in a scan controller 20 for energizing the plates 16, 18 to achieve a desired scanning pattern. A semiconductor wafer 22 is positioned for processing in the target plane 15 in the path of the ion beam 12 and is mounted on a support platen 26.

A beam sensing assembly 30 is positioned in the path of the beam 12 between the deflection plates 16 and the wafer 22. The assembly 30 provides a beam signal $I_B$ representative of ion beam current to a dose processor and uniformity monitor assembly 32. Signals x-scan and y-scan, corresponding to the deflection signals supplied to deflection plates 16, 18, are supplied to assembly 32. The function of the beam sensing assembly 30 and the dose processor and uniformity monitor assembly 32 are described in detail hereinafter. A typical ion implantation system includes dual target chambers and an automatic wafer handling system for transferring semiconductor wafers through vacuum locks for introduction into the target chambers. The wafer handling system properly locates, aligns and cools the wafers during processing and removes the processed wafer from the chamber at the conclusion of processing. Such wafer handling and cooling is not within the scope of the present invention.

Figure 2:
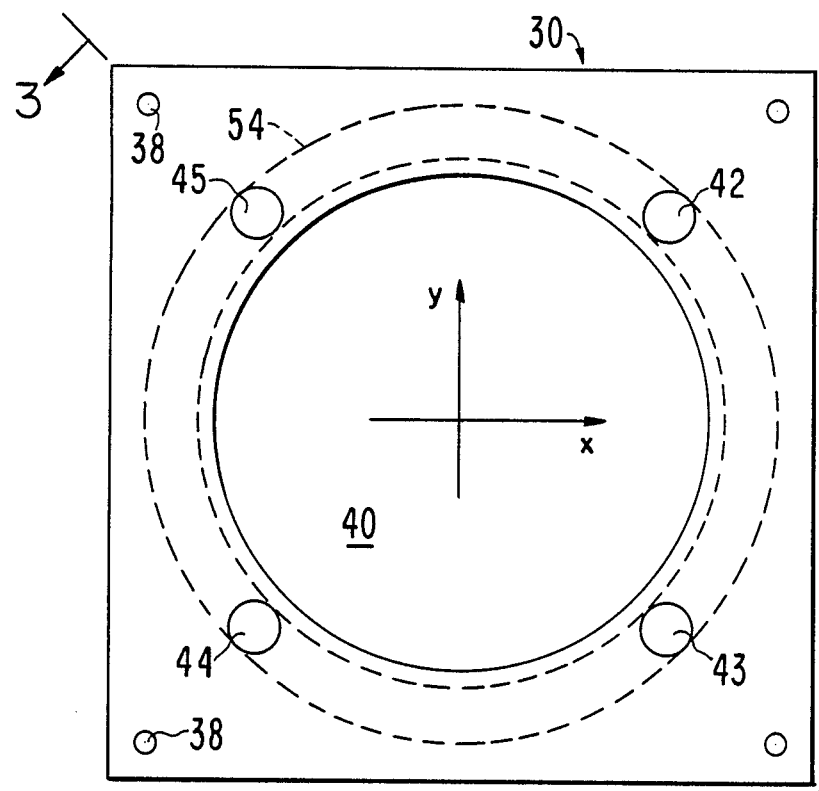
FIG. 2 illustrates the mask assembly of the system shown in FIG. 1 as viewed along the ion beam axis.

The beam sensing assembly 30 is shown as viewed along the beam axis in FIG. 2 and in cross-section in FIG. 3. A mask plate 36 includes mounting holes 38 for mounting the assembly 30 in the path of the ion beam 12. The mask plate 36 is provided with a relatively large circular aperture 40 for passage of the beam 12 to the wafer 22. The aperture 40 must be large enough to avoid shadowing the wafer 22. An x-y coordinate system having an origin at the center of the aperture 40 is shown in FIG. 2. When the beam 12 is not scanned it passes along a z axis (FIG. 1) through the origin of the x-y plane and is offset by a fixed angle, typically seven degrees (not shown), to remove neutral particles from the beam 12. Sensing apertures 42, 43, 44, 45 are provided in the mask plate 36 around the periphery of the aperture 40. Preferably the sensing apertures 42, 43, 44, 45 are equally spaced and are each oriented at 45° with respect to the x-y axis. Each of the sensing apertures 42, 43, 44, 45 leads to a beam current sensor. In operation, the ion beam 12 is raster scanned over the surface of the mask plate 36 in a generally rectangular pattern. The majority of the beam 12 passes through the aperture 40 and is implanted in the wafer 22. When the beam 12 passes over the sensing apertures 42, 43, 44, 45, it is measured as described hereinafter. When the apertures 42, 43, 44, 45 are positioned close to the aperture 40 at 45° angles with respect to the x and y axes, the required overscan is minimized.

A detailed cross-sectional view of the beam sensing assembly 30 is shown in FIG. 3. An aperture plate 48, typically of graphite, is mounted to the rear of the mask plate 36 and accurately defines the dimensions of the sensing apertures 42, 43, 44, 45. Graphite resists sputtering by the ion beam 12. Mounted behind each aperture in the aperture plate 48 are a first bias electrode 50 and a second bias electrode 52. Mounted behind the electrodes 50, 52 is an annular Faraday cup 54. The electrodes 50, 52 and the Faraday cup 54 are contained within an annular cover or housing 56. The electrodes 50, 52 and the Faraday cup 54 are insulated from each other and from ground by a series of insulated standoffs (not shown). Electrode 50 is typically biased at about −300 volts, and electrode 52 is typically biased at about −200 volts. Electrodes 50, 52 function to contain secondary electrons generated within the Faraday cup 54. Faraday cup 54 is an annular conductive ring coaxial with the aperture 40 and of larger diameter than aperture 40. It has four beam collection holes 55 partially through the thickness of the ring and aligned with apertures 42, 43, 44, 45. The holes 55 collect ions passing though the sensing apertures 42, 43, 44, 45. Faraday cup 54 has a single electrical connection to the dose processor and uniformity monitor assembly 32 as shown in FIG. 1.

Figure 6:
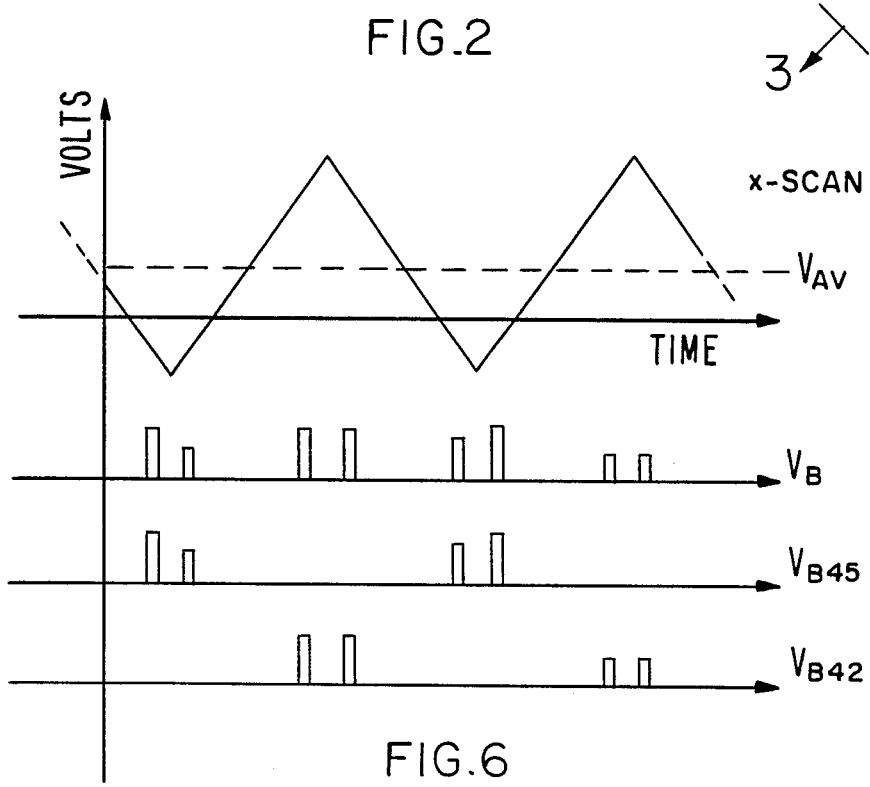
FIG. 6 is a graphical representation of voltage waveforms in the demultiplexer of FIG. 5.
Figure 4:
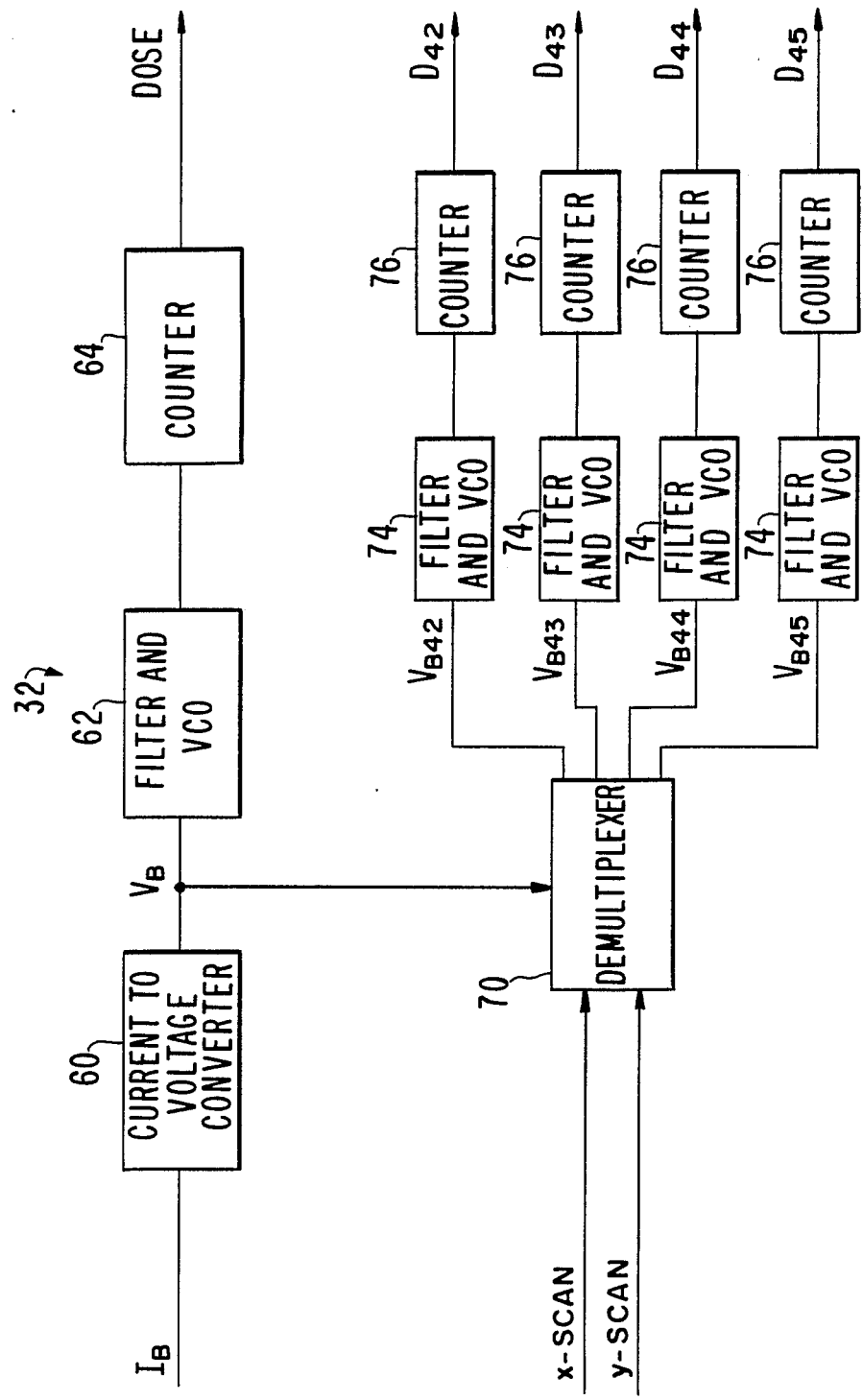
FIG. 4 is a block diagram of the dose processor and uniformity monitor shown in FIG. 1.

A block diagram of the dose processor and uniformity monitor assembly 32 is shown in FIG. 4. The beam current signal $I_B$ from the annular Faraday cup 54 is supplied to a current to voltage converter 60 which can be a resistor or an operational amplifier. Pulses of beam current are received by the Faraday cup 54. The amplitude and duration of the pulses depends on beam current, area of the aperture, the scan speed and whether the beam 12 passes directly across the center of the aperture or across an edge thereof. Since the geometry of the apertures and the scan characteristics are known, the beam current is the only variable. The output voltage $V_B$ of the converter 60 is a pulse train as shown in FIG. 6, which represents the beam current received by all four apertures, 42, 43, 44, 45. The voltage $V_B$ is supplied to a voltage to frequency converter which is typically a voltage controlled oscillator 62 operating in the range between 0 Hz and 9400 Hz. The oscillator 62 includes at its input a low pass filter which takes the average value of the voltage $V_B$. The output of the oscillator 62 is a frequency dependent upon ion beam current. The output of the oscillator 62 is accumulated in a digital counter 64 during the implant. The number stored in counter 64 represents the cumulative ion dosage during the time to implant a wafer. When a prescribed count representing a desired dosage is reached, the implant is terminated.

The output voltage $V_B$ of the converter 60 is also supplied to a demultiplexer 70 which receives x-scan and y-scan signals from the scan controller 20 and demultiplexes the voltage $V_B$ into separate components $V_{B42}$, $V_{B43}$, $V_{B44}$, $V_{B45}$ representing the beam current received at the sensing apertures 42, 43, 44, 45, respectively. These individual voltages are supplied to voltage-to-frequency converters such as voltage controlled oscillators 74 which generate an output frequency dependent on the voltage input. The oscillators 74 at their inputs include low pass filters which take the average value of the voltages $V_{B42}$, $V_{B43}$, $V_{B44}$, and $V_{B45}$. The outputs of oscillators 74 are supplied to counters 76 which accumulate the outputs of the respective oscillators 74 to which they are connected. Each combination of an oscillator 74 and a counter 76 determines the dose received in one corner Faraday cup during the implant. The outputs $D_{42}$, $D_{43}$, $D_{44}$, $D_{45}$ represent the cumulative dosage at each of the corner cups. The values of dosage at each corner cup are compared with an average dosage value and deviations are determined. The deviations from the average value are a measure of the uniformity of the implant.

Figure 5:
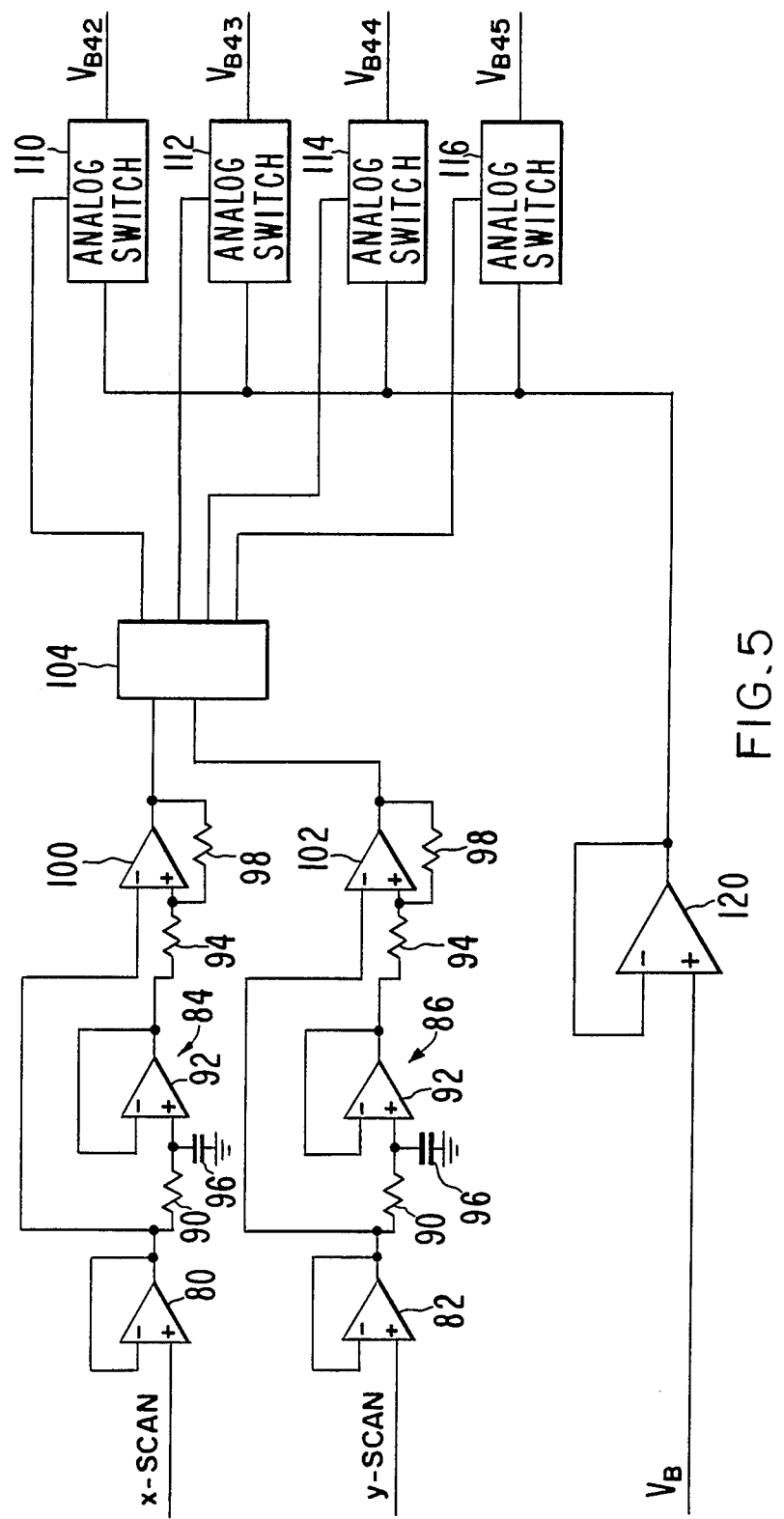
FIG. 5 is a block diagram of the demultiplexer shown in FIG. 4.

A schematic diagram of the demultiplexer 70 is shown in FIG. 5. The x-scan and y-scan signals are supplied to buffer amplifiers 80, 82, each comprising an operational amplifier with the output connected to the inverting input. The outputs of the buffer amplifiers 80, 82 are supplied to detector circuits 84, 86, respectively, which detect the average DC component of the input waveform. Referring now to FIG. 6, there is shown a graphic representation of the x-scan signal. The x-scan signal is a periodic waveform comprising successive positive and negative ramp voltages which sweep the ion beam across target plane. The x-scan signal typically has a non-zero average voltage $V_{AV}$. When the instantaneous value of the x-scan signal is greater than $V_{AV}$, the beam is located in the right half of the x-y plane, while values of the x-scan signal less than $V_{AV}$ deflect the ion beam to the left half of the x-y plane. The y-scan signal has a similar waveform but a substantially longer period, since many x axis scans are completed during one vertical sweep of the target plane. The x-scan and y-scan signals are similar to raster scan signals used in cathode ray tube technology.

Each of the detectors 84, 86 includes an input resistor 90 connected to the noninverting input of an operational amplifier 92. A capacitor 96 is connected between the noninverting input of each operational amplifier 92 and ground. The output of each operational amplifier 92 is connected to the inverting input and represents the average DC component of the input signal. The output of the detector 84 is supplied through a resistor 94 to the non-inverting input of a comparator 100. The output of the buffer amplifier 80 is supplied to the inverting input of the comparator 100. The output of the detector 86 is supplied through a resistor 94 to the non-inverting input of the comparator 102, while the output of the buffer amplifier 82 is supplied to the inverting input of the comparator 102. A resistor 98 is coupled between the output of each of the comparators 100, 102 and the noninverting input. Each resistor pair 94, 98 provides hysteresis in the comparator operation. The comparators 100, 102 compare the instantaneous value of the x-scan and y-scan signals with the respective average values and provide an output signal of one state when the instantaneous value exceeds the average value and a second output state when the instantaneous value does not exceed the average value. The outputs of comparators 100, 102 are supplied to a binary decoder 104. The decoder 104 decodes the possible output states of the comparators 100, 102 into an active signal on one of four output lines depending on the location of the ion beam 12.

The demultiplexer circuit shown in FIG. 5 and described above determines the aperture upon which the ion beam 12 is incident at each instant of time. This information permits the composite beam signal $V_B$ to be broken down, or demultiplexed, into the components received from each aperture. The various states of the x-scan and y-scan signals as related to aperture location are summarized in Table 1. Thus, for example, when the x-scan signal and the y-scan signal are both greater than their average values, respectively, as shown by the axes in FIG. 2, the ion beam 12 is in the upper right quadrant and current from the Faraday cup 54 is received through the aperture 42.

TABLE I

| X-Scan Value | Y-Scan Value | Aperture |
|---|---|---|
| X-scan > $V_{AV}$ | y-scan > $V_{AV}$ | 42 |
| X-scan > $V_{AV}$ | y-scan > $V_{AV}$ | 43 |
| X-scan < $V_{AV}$ | y-scan > $V_{AV}$ | 45 |
| X-scan < $V_{AV}$ | y-scan < $V_{AV}$ | 44 |

Referring again to FIG. 5, the outputs of the decoder 104 are used to control analog switches 110, 112, 114, 116 which can be field effect transistor analog switches. The voltage $V_B$ is applied to a buffer amplifier 120 having its output connected to the analog input of each of the analog switches 110, 112, 114, 116. The buffer amplifier 120 can comprise an operational amplifier having its output connected to its inverting input with the input signal received at the non-inverting input. The outputs of the analog switches 110, 112, 114, 116 represent the portion of the beam signal $V_B$ received at each individual aperture 42, 43, 44, 45. Thus the composite beam signal $V_B$ has been demultiplexed into its individual components $V_{B42}$, $V_{B43}$, $V_{B44}$, and $V_{B45}$. The individual beam current components from each of the apertures are processed to determine deviation from an average value which indicates uniformity.

Waveforms associated with the operation of the demultiplexer 70 are shown in FIG. 6. The ion beam 12 is assumed to be scanning in accordance with the x-scan signal in the region of the apertures 42, 45. The y-scan signal (not shown) gradually deflects the beam 12 up and down across the sensing assembly 30. The voltage $V_B$ from the converter 60 includes pulses of varying amplitude and duration received through both of the apertures 42, 45 as described above. The demultiplexer separates the voltage $V_B$ into its components. The voltage $V_B$ pulses occuring during the time when the x-scan signal is less than $V_{AV}$ are directed to output $V_{B45}$. The voltage $V_B$ pulses occuring when the x-scan signal is greater than $V_{AV}$ are directed to output $V_{B42}$. Similar demultiplexing of the voltage $V_B$ is performed when the beam 12 is scanning over the apertures 43, 44.

In operation, a wafer 22 is mounted in the target plane 15. The beam 12 is switched from a beam dump onto the wafer 22 and is scanned by the x-scan and y-scan signals over the surface area continuously. The beam 12 is overscanned beyond the edges of the wafer 22 by a sufficient amount to cover the apertures 42, 43, 44, 45. During the implant of the wafer 22, the system shown and described hereinabove continuously measures cumulative dose by accumulating the beam current signals received at all of the apertures 42, 43, 44, 45. In addition, the system monitors ion dose uniformity by individually monitoring the dose received at each of the corner Faraday cups and comparing the measured values with an average value. Deviations from the average indicate a non-uniform dose.

The dose measurement and uniformity monitoring system of the present invention simplifies construction and improves reliability in comparison with prior art systems. As a result ion implantation systems are easier to manufacture and are lower in cost. In addition, the target wafer can be grounded since it is not part of the Faraday system. Furthermore, the present invention permits the ion beam to reach the wafer without passing through secondary electron suppression fields which can adversely affect dose uniformity, since the fields are localized in the region of the corner Faraday cups.

While there has been shown and described what is at present considered the preferred embodiments of the present invention, it will be obvious to those skilled in the art that various changes and modifications may be made therein without departing from the scope of present invention as defined by the appended claims. For example, the system of the present invention has been described in connection with ion implantation of semiconductor wafers. However, the present invention can be utilized in any scanned ion beam system requiring measurement of dose and dose uniformity.

What is claimed is:

1. Apparatus for determining ion dose and ion dose uniformity of an ion beam scanned over a target plane in response to a scanning signal, comprising:
    means for sensing the ion beam received at a plurality of different sensing locations and providing a single beam signal representative of the total ion beam current received at all of the sensing locations;
    means for integrating said single beam signal with respect to time to determine ion dose; and
    uniformity monitoring means responsive to said scanning signal and said single beam signal for determining the component of said beam current received at each of said different sensing locations and determining ion dose uniformity therefrom.

2. Apparatus as defined in claim 1 wherein said sensing means comprises a Faraday cup at each of the different sensing locations, said Faraday cups having a common electrical connection which carries said single beam signal.

3. Apparatus as defined in claim 2 including four Faraday cups equally spaced about a beam axis in a sensing plane substantially perpendicular to the beam axis.

4. Apparatus as defined in claim 1 wherein said sensing means includes a mask assembly positioned in the path of said ion beam in a plane substantially perpendicular to the beam, said mask assembly including
    a mask plate having a first aperture for passage of the ion beam to the target plane and a plurality of beam sensing apertures positioned at each of said sensing locations around said first aperture, and
    an annular Faraday cup positioned behind said mask plate in alignment with said sensing apertures for sensing the total beam current received through all of said sensing apertures and providing said single beam signal.

5. Apparatus as defined in claim 4 wherein said first aperture in said mask plate is circular and coaxial with the beam axis and wherein said plurality comprises four sensing apertures equally spaced around the periphery of said first aperture.

6. Apparatus as defined in claim 4 wherein said annular Faraday cup has a diameter larger than said first aperture and is coaxial with said first aperture, said Faraday cup having beam collection holes aligned with said sensing apertures.

7. Apparatus as defined in claim 4 further including a graphite aperture plate mounted between said mask plate and said annular Faraday cup, said aperture plate including accurately dimensioned apertures aligned with the sensing apertures in said mask plate, and
    at least one bias electrode mounted between each aperture in said aperture plate and said annular Faraday cup to suppress secondary electrons.

8. Apparatus as defined in claim 1 wherein said uniformity monitoring means includes demultiplexing means responsive to said scanning signal for identifying the sensing location of each beam current component and for switching said beam signal in response to said determination.

9. Apparatus as defined in claim 8 when said ion beam is scanned in a two-dimensional raster scan pattern by x-scan and y-scan signals and said demultiplexing means includes means for identifying the quadrant of each component of said beam current.

10. Apparatus as defined in claim 9 wherein said demultiplexing means includes
    averaging means for determining the average value of said x-scan signal and said y-scan signal,
    comparator means for comparing average values of said x-scan and y-scan signals with the respective instantaneous values thereof,
    decoder means responsive to the outputs of said comparator means for determining the quadrant in which the ion beam is located at any instant of time, and
    switching means responsive to the outputs of said decoder means for switching said beam signal to prescribed outputs depending on the sensing location at which it was received.

11. Apparatus is defined in claim 10 wherein said uniformity monitoring means further includes means responsive to the outputs of said demultiplexer means for determining the deviation of the beam signal at each of said different sensing locations from a reference value, said deviation providing a measure of ion dose uniformity.

12. Apparatus for determining ion dose and ion dose uniformity of a scanned ion beam comprising:
    means for generating and directing an ion beam along an axis;
    means for scanning said ion beam in two dimensions perpendicualr to said axis over a target plane in response to x-scan and y-scan beam scanning signals;
    means for sensing the ion beam received at a plurality of different sensing locations and providing a single beam signal representative of the total ion beam current received at all of the sensing locations;
    means for integrating said single beam signal with respect to time to determine ion dose; and
    uniformity monitoring means responsive to said scanning signals and said single beam signal for determining the component of said beam current received at each of said different sensing locations and determining ion dose uniformity therefrom.

13. Apparatus as defined in claim 12 wherein said means for sensing includes a mask assembly positioned between said means for generating and said target plane, said mask assembly comprising
    a mask plate having a relatively large first aperture therethrough for passage of the ion beam to said target plane and a plurality of smaller sensing apertures positioned around said target aperture, and
    an annular Faraday cup positioned behind said mask plate around said first aperture in alignment with said sensing apertures for sensing the beam current passing through all of said sensing apertures and providing said beam signal.

14. Apparatus as defined in claim 13 wherein said first aperture in said mask plate is circular and coaxial with the beam axis and wherein said plurality comprises four sensing apertures equally spaced around the periphery of said first aperture.

15. Apparatus as defined in claim 13 wherein said annular Faraday cup has a diameter larger than said first aperture and is coaxial with said first aperture, said Faraday cup having beam collection holes aligned with said sensing apertures.

16. Apparatus as defined in claim 13 further including
a graphite aperture plate mounted between said mask plate and said annular Faraday cup, said aperture plate including accurately dimensioned apertures aligned with the sensing apertures in said mask plate, and
at least one bias electrode mounted between each aperture in said aperture plate and said annular Faraday cup to suppress secondary electrons.

17. Apparatus as defined in claim 12 wherein said uniformity monitoring means includes demultiplexing means responsive to said scanning signal for identifying the sensing location of each component of said beam current and for switching said beam signal in response to said determination.

18. Apparatus as defined in claim 17 wherein said ion beam is scanned in a two-dimensional raster scan pattern by x-scan and y-scan signals and said demultiplexing means including means for identifying the quadrant of each component of said beam current.

19. Apparatus as defined in claim 18 wherein said demultiplexing means includes
averaging means for determining the average value of said x-scan signal and said y-scan signal,
comparator means for comparing average values of said x-scan and y-scan signals with the respective instantaneous values thereof,
decoder means responsive to the outputs of said comparator means for determining the quadrant in which the ion beam is located at any instant of time, and
switching means responsive to the outputs of said decoder means for switching said beam signal to prescribed outputs depending on the sensing location at which it was received.

20. A method for determining ion dose and ion dose uniformity of an ion beam scanned over a target plane in response to a scanning signal, said method comprising the steps of:
sensing the ion beam received at a plurality of different sensing locations and providing a single beam signal representative of the total ion beam current received at all of the sensing locations;
integrating said beam signal with respect to time to determine ion dose; and
utilizing said scanning signal and said single beam signal for determining the component of said beam current received at each of said different sensing locations and determining ion dose uniformity therefrom.

* * * * *